(12) United States Patent
Lee et al.

(10) Patent No.: US 8,242,611 B2
(45) Date of Patent: Aug. 14, 2012

(54) BONDING METALLURGY FOR THREE-DIMENSIONAL INTERCONNECT

(75) Inventors: Bo-I Lee, Sindian (TW); Dean Wang, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 12/944,377

(22) Filed: Nov. 11, 2010

(65) Prior Publication Data

US 2011/0058346 A1    Mar. 10, 2011

Related U.S. Application Data

(62) Division of application No. 12/176,770, filed on Jul. 21, 2008, now Pat. No. 7,851,346.

(51) Int. Cl.
*H01L 23/48* (2006.01)
*H01L 23/52* (2006.01)

(52) U.S. Cl. ........ 257/781; 257/698; 257/751; 257/762; 257/765; 257/E23.011

(58) Field of Classification Search .......... 257/737, 257/750–751, 781, 784, E23.01, E23.011, 257/698, 762, 765
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,133,136 A | 10/2000 | Edelstein et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |

(Continued)

FOREIGN PATENT DOCUMENTS

JP         10-223833         8/1998

*Primary Examiner* — Thanhha Pham
(74) *Attorney, Agent, or Firm* — Slater & Matsil, L.L.P.

(57) ABSTRACT

A method provides a first substrate with a conductive pad and disposes layers of Cu, TaN, and AlCu, respectively, forming a conductive stack on the conductive pad. The AlCu layer of the first substrate is bonded to a through substrate via (TSV) structure of a second substrate, wherein a conductive path is formed from the conductive pad of the first substrate to the TSV structure of the second substrate.

20 Claims, 8 Drawing Sheets

U.S. PATENT DOCUMENTS

| | | | |
|---|---|---|---|
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,315,072 B2 | 1/2008 | Wantanabe |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2008/0203568 A1* | 8/2008 | Tanaka et al. ................. 257/738 |

* cited by examiner

BONDING METALLURGY FOR THREE-DIMENSIONAL INTERCONNECT

This application is a divisional and claims the priority of benefit to U.S. patent application Ser. No. 12/176,770, entitled "Bonding Metallurgy for Three-Dimensional Interconnect," filed on Jul. 21, 2008, now issued as U.S. Pat. No. 7,851,346, which application is incorporated herein by reference.

TECHNICAL FIELD

The present invention relates generally to a structure and a method of substrate-to-substrate bonding for three-dimensional interconnect substrates and in particular to a structure and a method of bonding a through substrate via assembly to a Cu joint.

BACKGROUND

Semiconductor devices are manufactured by forming active regions in a semiconductor substrate, depositing various insulating, conductive, and semiconductive layers over the substrate, and patterning them in sequential steps. The upper or last-formed layers of the semiconductor device typically comprise metallization layers. The metallization layers typically comprise one or more layers of metal interconnect having conductive lines disposed within an insulating material, and may provide connections to underlying active regions and connections within and over the substrate.

As the cost of shrinking semiconductor devices continues to increase, alternative approaches, such as extending the integration of circuits into the third dimension or semiconductor substrate stacking are being explored. Two or more substrates are bonded together to form a three-dimensional structure.

FIG. 1 illustrates a prior art structure for bonding substrates. Top die 102 is bonded to bottom substrate 104 employing bumps 110. Further bottom substrate 104 comprises through substrate vias (TSVs) 112, and top die 102 comprises Cu/Ni pads 108. Bump 110 is a eutectic solder micro-bump joint implemented to bond the Cu surfaces. In solder bump interconnects, solder wetting onto bond pads is a key factor that determines the interconnect process yield and the solder joint reliability. Solder wetting involves various physical attributes such as surface tension imbalance, viscous dissipation, molecular kinetic motion, chemical reaction, and diffusion. The degree of wetting may be described by the contact angle, the angle at which the liquid interface meets the solid interface. The degree of wetting between Cu and conventional eutectic solder may not be optimum. If the wetting is poor, the solder may form a compact droplet on the copper surface, leaving insufficient area bonded between the copper and the eutectic solder.

Further solder joint reliability may be a problem in that copper easily oxidizes and may oxidize during the solder process. Moreover, the relatively large size of the solder bumps 110, which may be in the range of tens of μms and greater, is not conducive to shrinking devices.

SUMMARY OF THE INVENTION

These and other problems are generally solved or circumvented, and technical advantages are generally achieved by forming a TaN/AlCu film on the metal pads of a first substrate for three-dimensional interconnects.

In one aspect is provided a structure comprising a first substrate with a conductive pad and a conductive stack disposed on the conductive pad. The conductive pad includes a CU layer, a TaN layer disposed on the Cu layer, and an AlCu layer disposed on the TaN layer. The AlCu layer is configured for bonding to a second substrate.

In another aspect is provided a structure comprising a first substrate comprising. The first substrate has a patterned Cu layer, a patterned TaN layer, disposed on the patterned Cu layer, and a patterned AlCu layer, disposed on the patterned TaN layer. The structure also includes a second substrate with a Cu region, wherein the patterned AlCu layer is bonded to the Cu region, thereby bonding the first substrate to the second substrate.

In yet another aspect is provided a packaged integrated circuit comprising n substrates, each substrate including a nth conductive pad. Each nth conductive pad has disposed thereon an nth Cu layer, an nth TaN layer, disposed on the nth Cu layer, and an nth AlCu layer, disposed on the nth TaN layer. Each substrate, except for the first substrate, further includes an (n−1)th Cu region, wherein a respective (n−1)th Cu region of an nth susbstrate is bonded to a respective (n−1)th AlCu layer of an (n−1)th substrate.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

Figure 2:
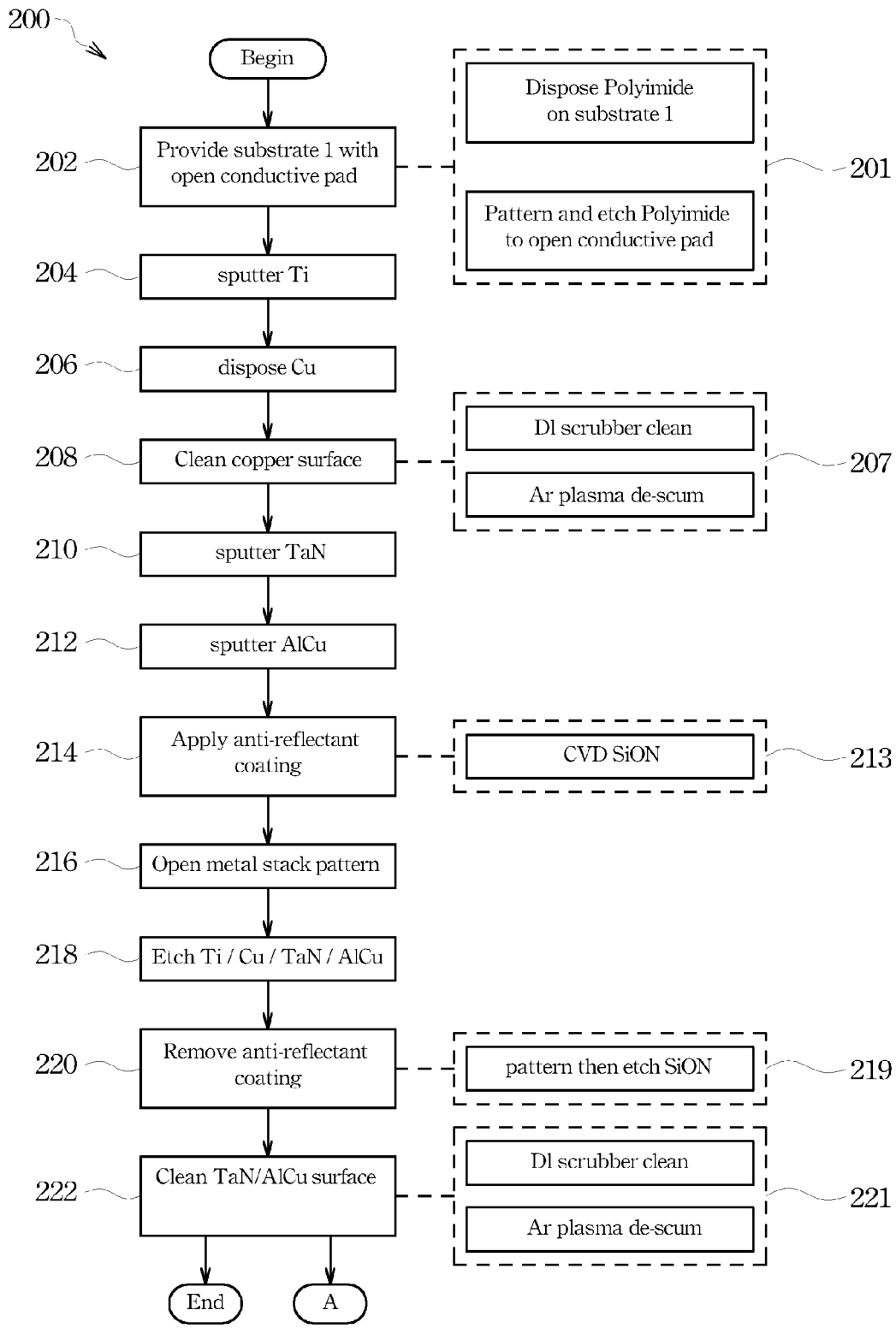
FIG. 2 shows selected process steps of a method for forming a TaN/AlCu film on the metal pads of a substrate for a three-dimensional interconnect, in accordance with an illustrative embodiment.

Turning to FIG. 2, selected process steps of a method for forming a TaN/AlCu film on the metal pads of a substrate for a three-dimensional interconnect are shown, in accordance with an illustrative embodiment. FIG. 2 shows selected optional processes and selected example processes, FIG. 2 does not limit the scope of an illustrative embodiment to these options and examples.

Process flow 200 begins by providing a first substrate with open conductive pads (step 202). Optionally a polyimide layer may be deposited on substrate 1. The polyimide layer may be patterned and etched to open conductive pads on substrate 1 (step 201). Titanium may be sputtered on substrate 1 (step 204), followed by a disposition of copper (step 206). The copper surface may then be cleaned (step 208). The clean may comprise a de-ionized water scrubber clean and a plasma de-scum (step 207). The plasma de-scum may use an Ar or another inert ion for example.

Tantulum nitride (TaN) is then disposed on substrate 1 (step 210). TaN may be disposed by a sputtering process, for example. Aluminum copper (AlCu) is then disposed on substrate 1 (step 212). AlCu may also be disposed by a sputtering process, for example.

An anti-reflective coating (ARC) may then be applied (step 214). The light absorbing chemistry aids in controlling light as it passes through the subsequently deposited photoresist during the photolithography required to define the metal stack. The result of an ARC layer is a dampening of reflected light on the surfaces and inside the material (destructive interference). Thus, an ARC layer may reduce or eliminate reflective notching and standing waves during the subsequent processing. An example ARC layer may be SiON (step 213). The SiON layer may be disposed in a chemical vapor deposition (CVD) process. A photolithography step 216 opens regions on substrate 1 that do not comprise the metal stack. The metal stack comprises the conductive pad, the titanium layer, the copper layer, the tantalum nitride layer, and the aluminum copper layer.

The aluminum copper, tantalum nitride, copper and titanium layer may then be etched (step 218). The etch may be performed in different equipment with differing etch chemistries, and for example may be a combination of plasma etch and/or wet etch. However, the etch is preferably accomplished without removing substrate 1 from vacuum.

The anti-reflective coating is then removed from the top of the conductive stack (step 220). In an embodiment, the substrate is patterned with photoresist leaving the top of the conductive stack with the SiON layer open. The SiON layer is then etched (step 219) and the remaining photoresist is removed.

Substrate 1 then undergoes a clean (step 222). An example clean may be a DI scrubber clean and/or a plasma de-scum (step 221). Thus the process may continue to bonding process steps "A" (see FIG. 11), other subsequent processing, or the process may end.

Figure 3:
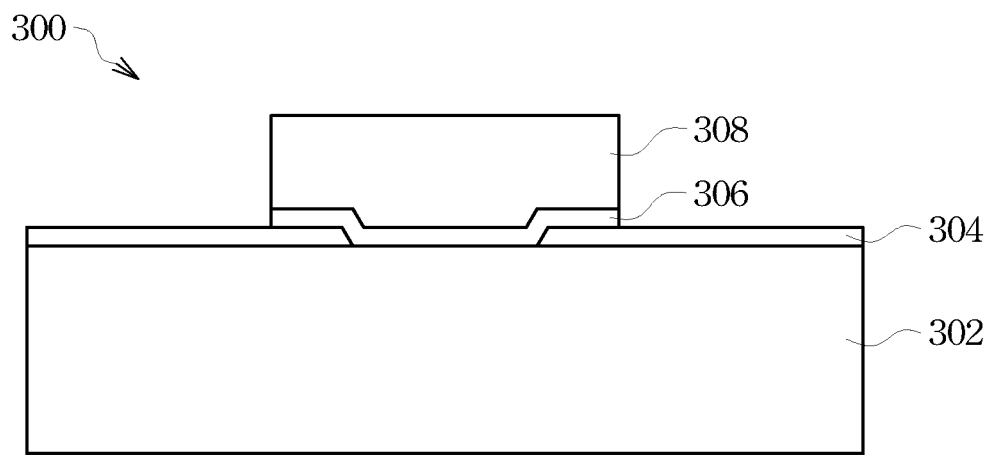
FIG. 3 is a selected cross-sectional illustration of a Ti/Cu under-bonding metallization structure.

FIG. 3 is a selected cross-sectional illustration of a Ti/Cu under bond metallization. Workpiece 300 is provided. Workpiece 300 may include semiconductor substrate 302 comprising silicon or other semiconductor materials, for example. Semiconductor substrate 302 may include one or more conductive layers. There may be multiple metallization layers formed within semiconductor substrate 302, for example, and semiconductor substrate 302 may include a plurality of other layers such as inter-poly oxide (IPO) or inter-metal dielectric (IMD) layers (not shown). Semiconductor substrate 302 may also include other active components or circuits. Further workpiece 300 may include additional substrates therein (also not shown).

Polyimide 304 is disposed onto semiconductor substrate 302. Polyimide 304 may be patterned, for example, by depositing a photoresist over the top surface of polyimide 304, and using a mask having transparent regions and opaque regions having a pattern formed therein to pattern the photoresist. Alternatively, polyimide 304 may be directly patterned using electron beam lithography (EBL), as an example. Preferably, polyimide 304 deposited over substrate 302 comprises a photosensitive dielectric material. Thus, the use of a photoresist is not required to pattern a photosensitive polyimide. Rather, in one embodiment, polyimide 304 is directly patterned using a lithography mask having transparent areas and opaque areas. Therefore, unlike photoresist, photo-sensitive polyimides are part of the chip package and therefore are not stripped. Polyimide 304 may be opened over a conductive pad (not shown).

Titanium layer 306 is disposed over polyimide 304. Copper 308 is disposed on titanium layer 306, by methods known in the art. Copper 308 and titanium layer 306 are patterned, and then etched, leaving the resultant cross sectional view shown in FIG. 3. Workpiece 300 then undergoes a de-ionized water scrubber clean and an argon plasma de-scum to clean copper 308.

Figure 4:
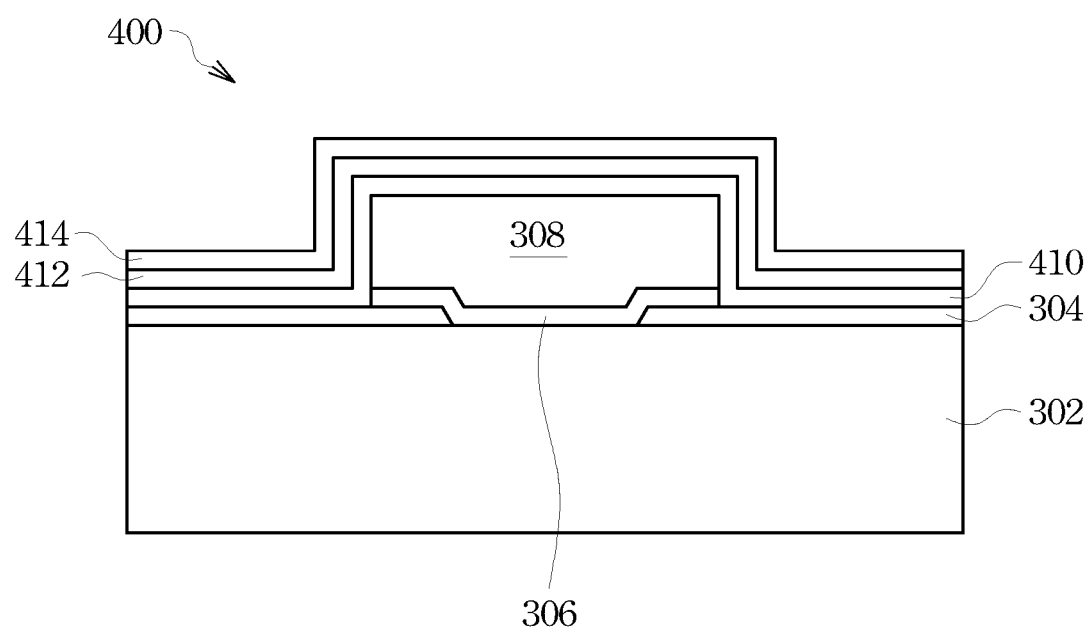
FIG. 4 shows the disposal of joint films TaN, AlCu, and the deposition of SiON as an anti-reflective coating.

FIG. 4 shows the disposal of joint films TaN, AlCu, and the deposition of SiON as an anti-reflective coating (ARC). TaN 410 may be sputtered. AlCu 412 may also be sputtered. Sputtering the TaN/AlCu film is a relatively low temperature process, thus the thermal budget of workpiece 400 is not exceeded. Further, the TaN/AlCu film is readily manufacturable on existing equipment in a conventional wafer fabrication facility. Thus implementing a TaN/AlCu process in place of a solder bump process may reduce the overall cost of the three-dimensional process. The thickness of the TaN/AlCu layer may be on the order of 1000s of angstroms thick as compared to a solder bump which may be on the order of tens of microns thick. SiON 414 may be deposited in a CVD process. SiON 414 is a sacrificial layer used for the ARC characteristics and then removed as discussed below. Corresponding numerals in the different figures refer to corresponding parts. Further reused numerals may not be described again as they label parts and layers of subsequent figures.

Figure 5:
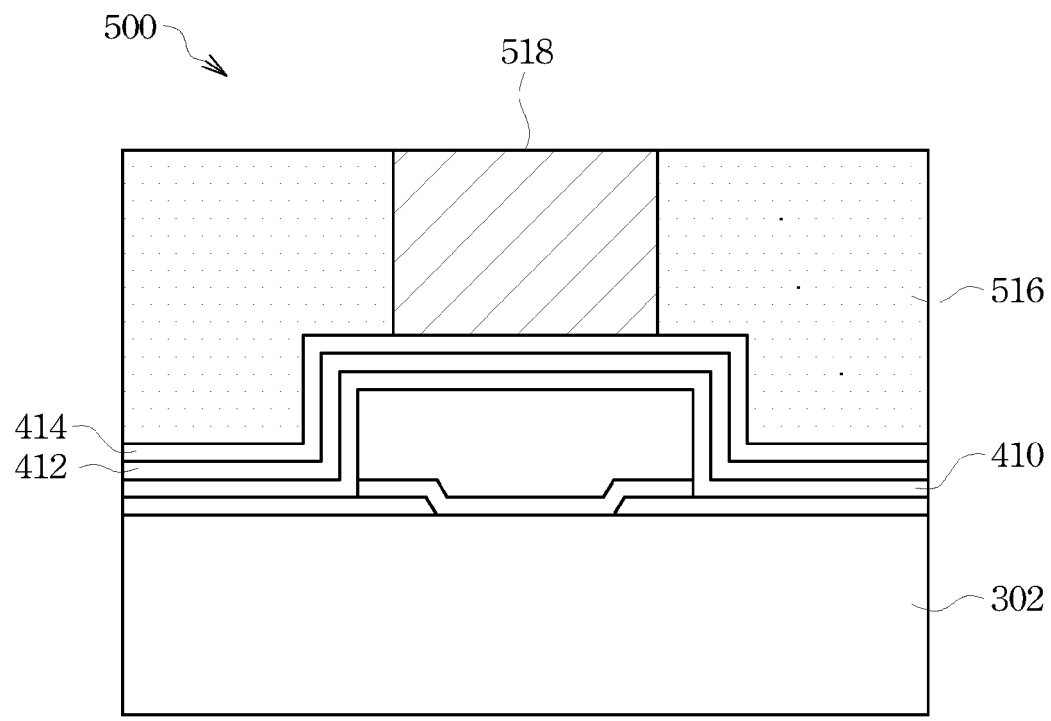
FIG. 5 shows a photolithography step of defining the joint film pattern.

FIG. 5 shows a resultant cross-section of a photolithography step defining the joint film pattern. Photoresist layer 516 is applied to workpiece 500. Photoresist layer 516 is patterned using a mask. The ARC layer SiON 414 aids in the patterning of the reflective metal layers. Workpiece 500 is then developed leaving patterned photoresist 518 remaining.

Figure 6:
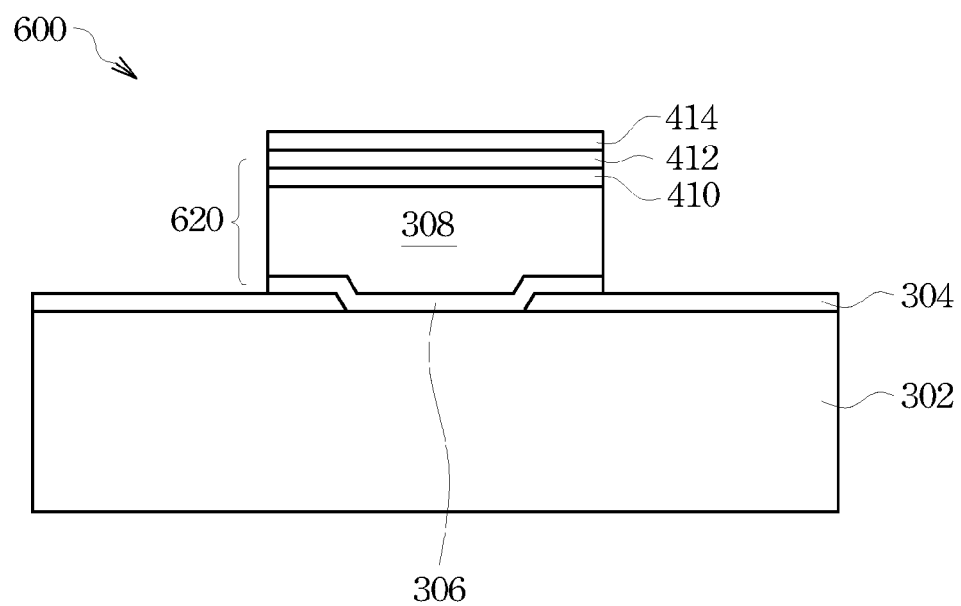
FIG. 6 shows the resulting work piece following the etch of the joint film leaving SiON remaining on the top portion of the conductive stack.

FIG. 6 shows a resulting workpiece 600 following a multilayer etch. The metal layers are removed from the unprotected areas leaving a top layer of polyimide 304. Conductive stack 620 remains comprising Ti 306, Cu 308, TaN 410, and AlCu 412. SiON 414 remains on conductive stack 620 following the etch. The remaining patterned photoresist is removed. FIG. 6 shows conductive stack 620 with the vertical layers of TaN 410, and AlCu 412 removed from the side walls.

Figure 7:
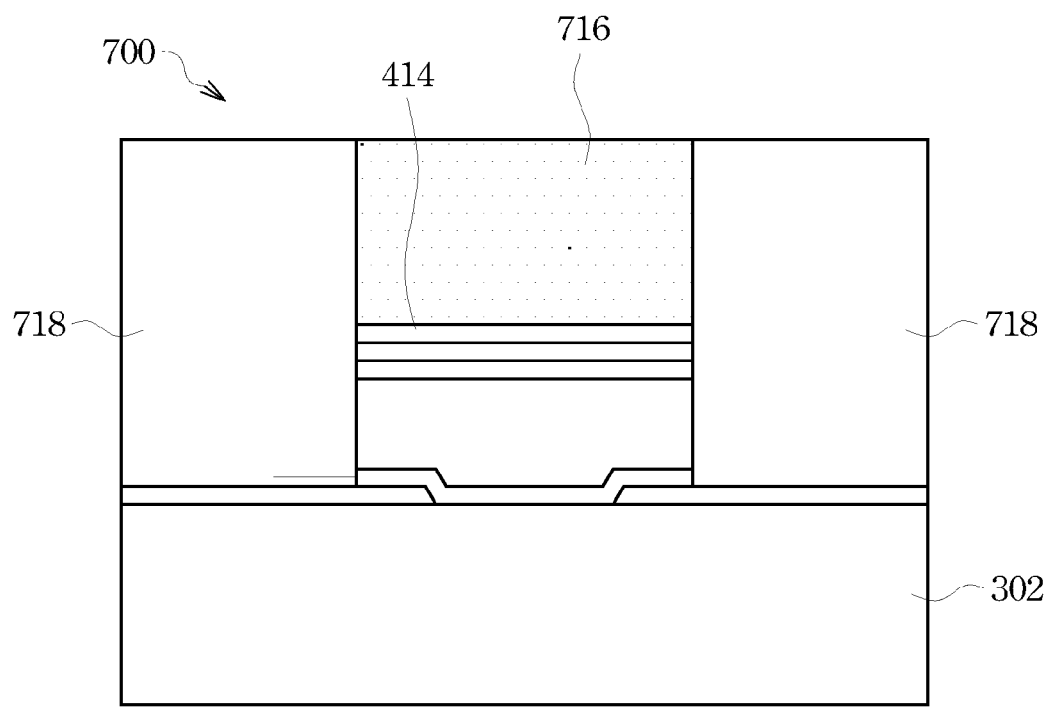
FIG. 7 shows a patterning step in preparation of etching SiON.

Turning to FIG. 7, SiON 114 is then removed by applying photoresist 718 and patterning workpiece 700, protecting areas 718 of workpiece 700 that have had the SiON 414 layer removed in a previous etch. FIG. 7 shows a patterned workpiece 700 in preparation of etching SiON 414.

Figure 8:
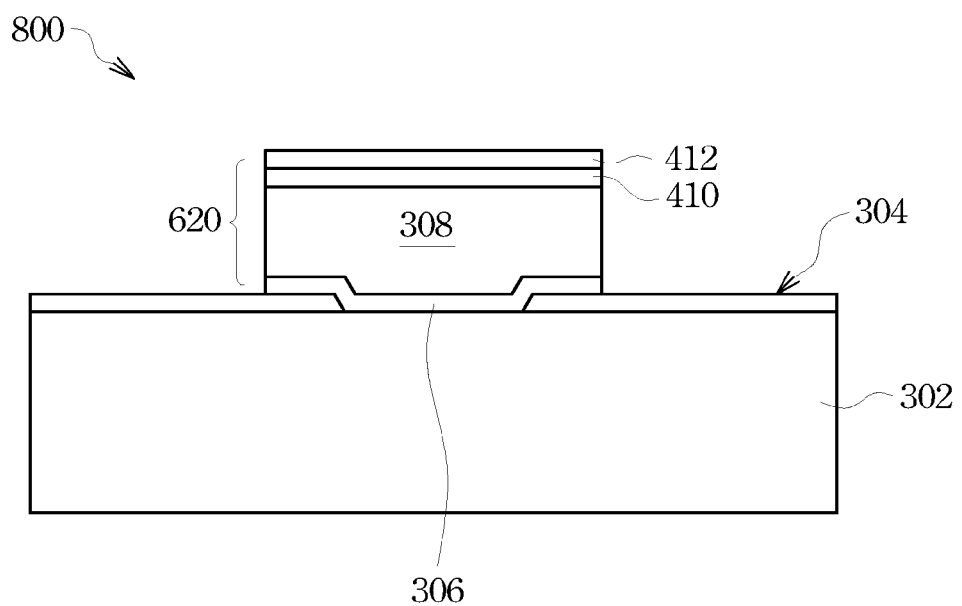
FIG. 8 shows the resultant structure following an etch process of the SiON film.

FIG. 8 illustrates the resultant work piece 800 following an etch process removing SiON 414. An argon plasma de-scum, a DI water rinse and a bake may then be preformed.

Figure 9:
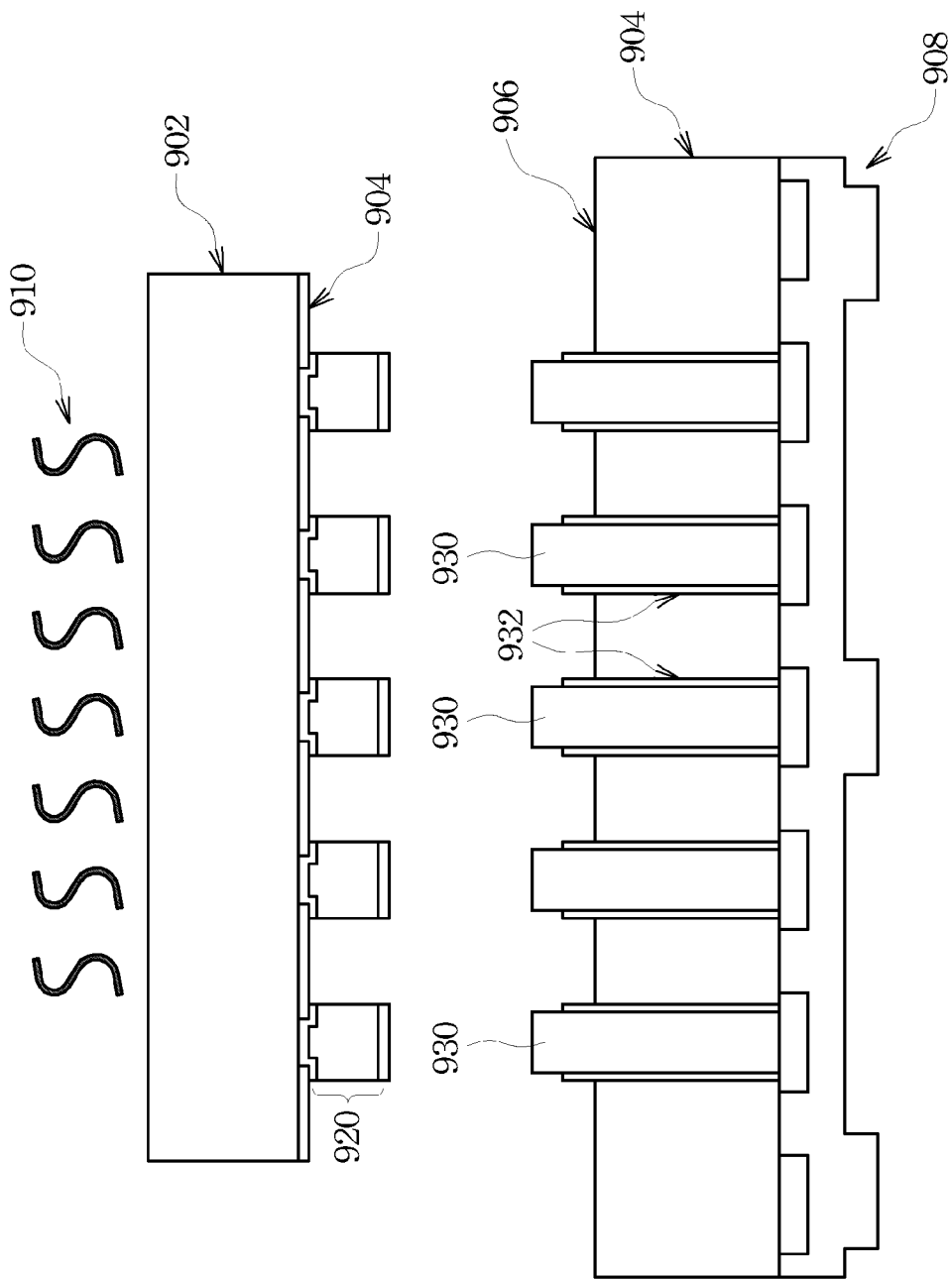
FIG. 9 shows top substrate and bottom Cu TSV substrate before bonding.

FIG. 9 shows top substrate 902 and bottom substrate 904 before bonding. Top substrate 902 may be similar to workpiece 800 in FIG. 8. Top substrate 902 is inverted with respect to workpiece 800 in FIG. 8, with top surface 904 comprising polyimide, such as polyimide 304 in FIG. 8. Conductive stack 920 of top substrate 902 may comprise Ti, Cu, TaN, and AlCu, such as Ti 306, Cu 308, TaN 410, and AlCu 412 in FIG. 8.

Bottom substrate 904 is also inverted with respect to standard substrate processing. Through substrate vias (TSVs) 930 extend out from surface 906 of bottom substrate 904. TSVs 930 have an insulating layer 932. TSVs 930 are comprised for example of Cu and/or Cu alloys.

Bottom substrate 904 may also have a conductive stack, thus layer 908 of substrate 904 may then be bonded to another substrate, package or directly in a system. A system may be comprised of a plurality of devices. In another embodiment, bottom substrate 904 may have a conductive stack similar to top substrate 902 on bottom surface 908.

Heat 910 may be applied during thermal compression bonding (TCB). TCB is known in the art and therefore not discussed further herein. In an illustrative embodiment, however, heat 910 is less than, for example, 175° C., making the process relatively low temperature.

Figure 1:
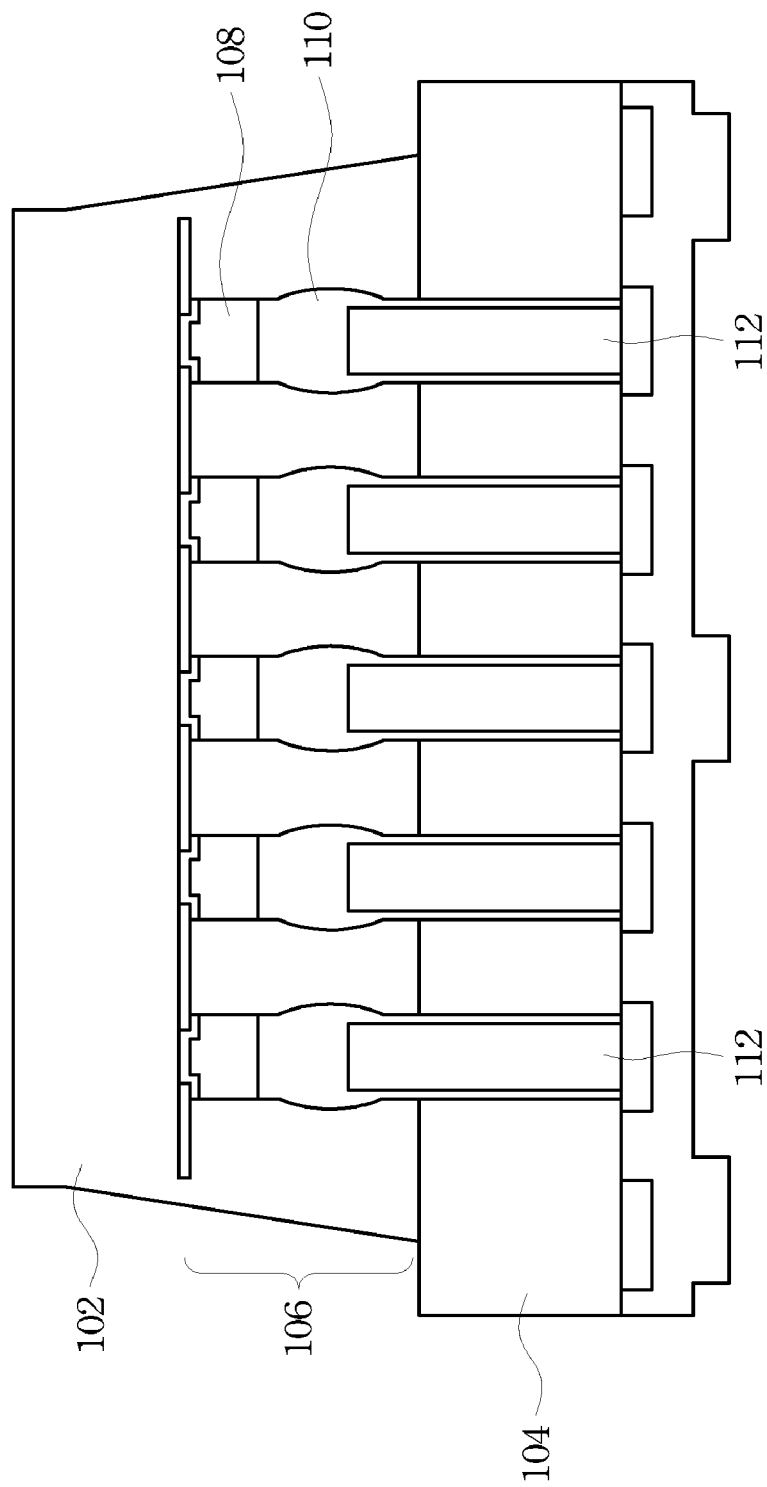
FIG. 1 is a prior art view of a eutectic micro-bump three-dimensional interconnect.
Figure 10:
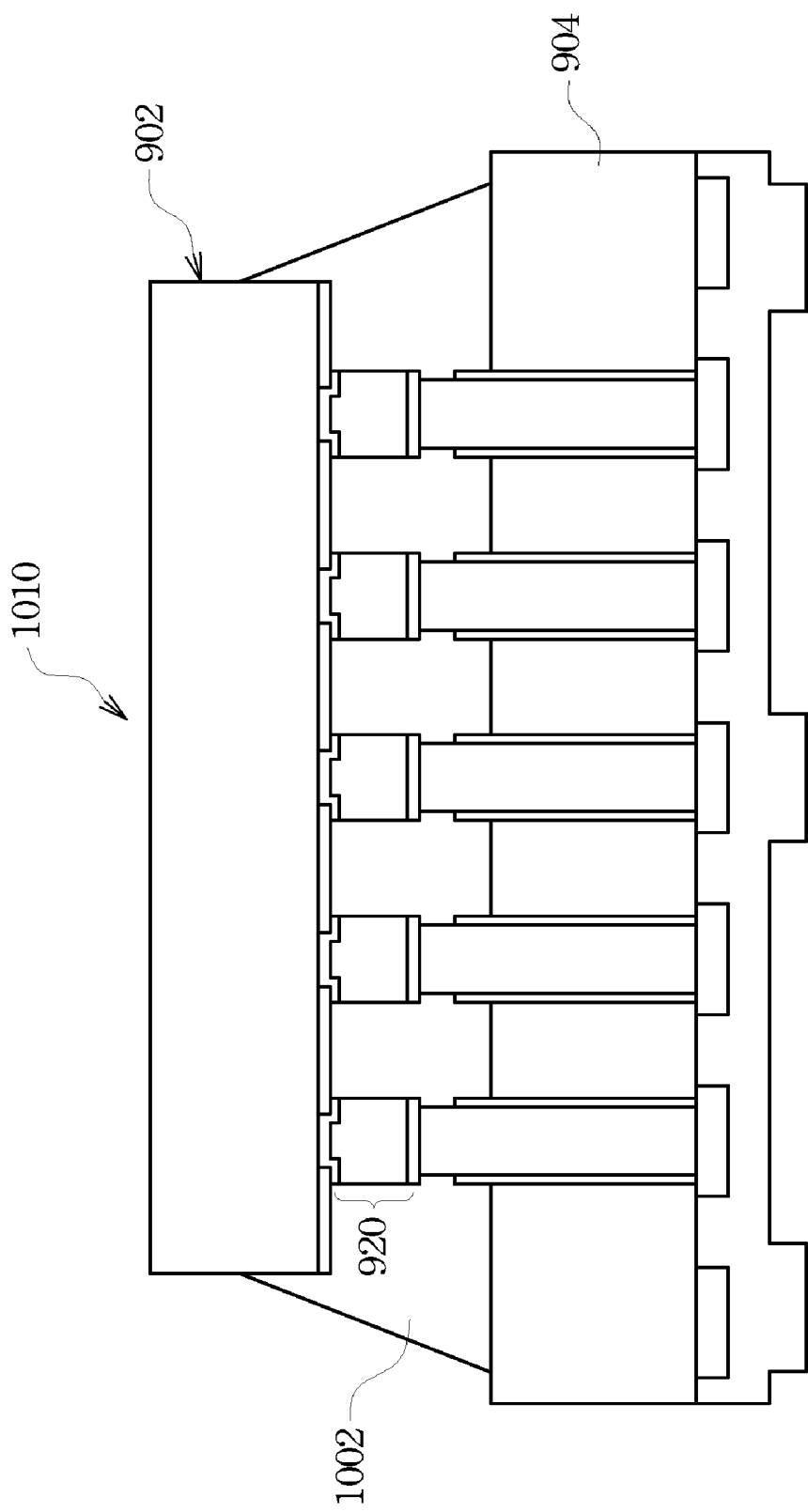
FIG. 10 shows a resultant structure with an optional polymer fill following the bonding process.

FIG. 10 shows bonded structure 1010 with an optional polymer fill 1002 following the bonding process. In an embodiment, conductive stack 920 is comprised of Ti, Cu, TaN, and AlCu, as shown in FIG. 9. The copper TSVs 930 are bonded directly to the AlCu on the surface of conductive stack 920 without a solder bump, such as solder bump 110 in FIG. 1. The TaN/AlCu layer adheres well to Cu, making a reliable low resistance contact. The thickness of TaN is in the angstrom range, for example, 100-1000 Å. The thickness of the AlCu layer is 10,000-15,000 Å. The thickness of the combined layer is much less than the thickness of a solder bump, which may be in the several micron or more thickness range. Therefore, an advantage of an illustrative embodiment is that the package size of the stacked substrates may be scaled down because of the fine pitch assembly of the TaN/AlCu film versus the solder bump. Optional polymer fill 1002 may add mechanical strength to the bonded structure 1010.

Figure 11:
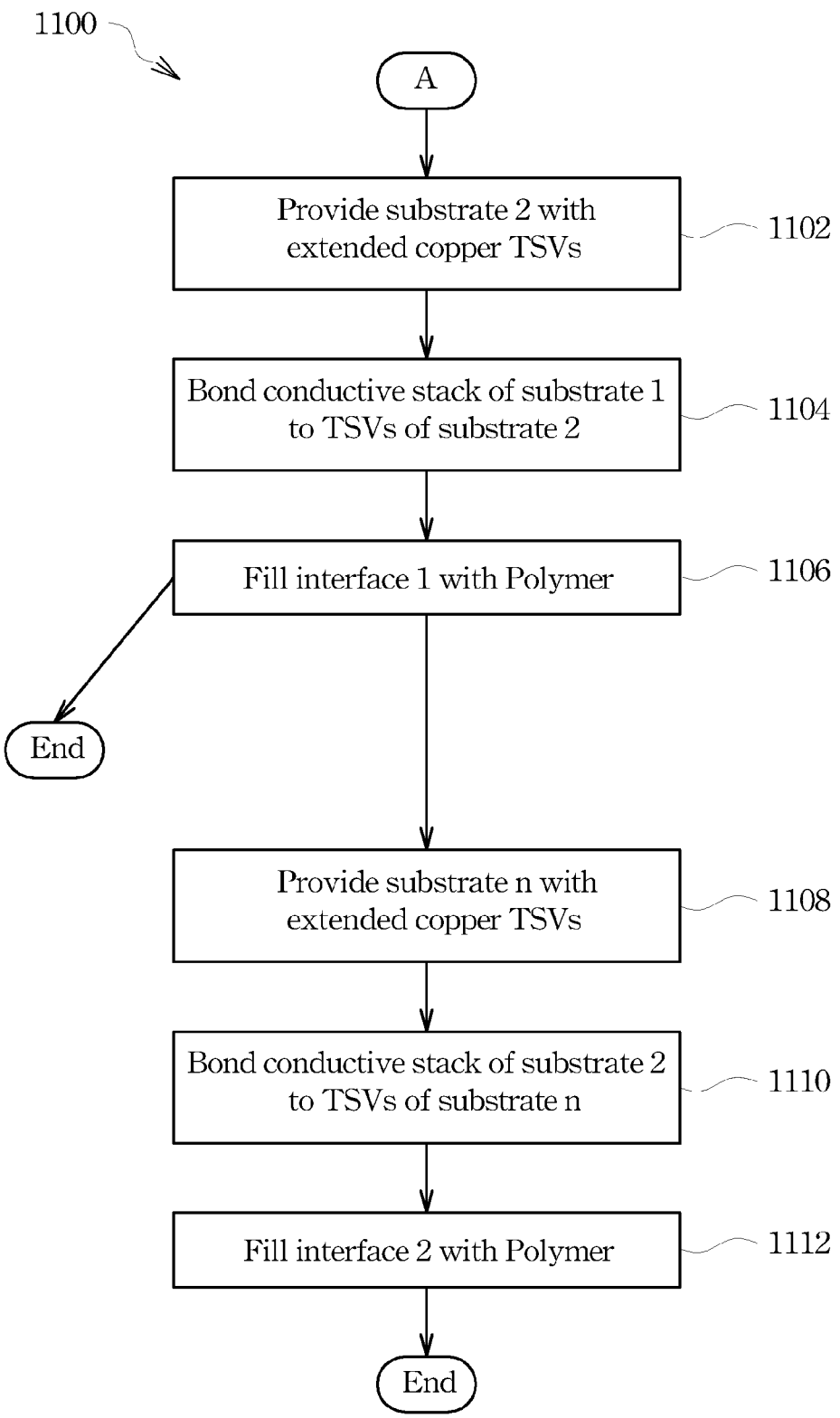
FIG. 11 shows a bonding process flow.

FIG. 11 is a flow chart showing process 1100 for bonding substrates. Process 1100 begins with a first substrate, such as substrate 902 in FIG. 9, comprising a conductive stack comprising TaN/AlCu layers (step "A" in FIG. 2). A second substrate, such as bottom substrate 904 in FIG. 9, is provided (step 1102). The second substrate has extended copper TSVs. The conductive stack of the first substrate is bonded to the respective TSV of the second substrate (step 1104). Optionally the interface between the first substrate and the second substrate may be filled with polymer (step 1106). The process may end or additional substrates may be attached.

Substrate n is provided with extended copper TSVs (step 1108). The second substrate is bonded to the TSVs of substrate n (step 1110). Again, the interface between substrate 2 and substrate n may be filled with a polymer (step 1112). Further substrates may be stacked similarly.

In yet another illustrative embodiment, a substrate, which includes a conductive stack comprising TaN/AlCu, and another substrate, which also includes a conductive stack comprising TaN/AlCu, are bonded conductive stack to conductive stack, in contrast to the conductive stack to TSV structure illustrated above. Further substrates may be stacked similarly.

In another illustrative embodiment, a substrate has a copper conductive pad, rather than a copper TSV structure, that extends from a surface of the substrate. Another substrate, with a conductive stack comprising TaN/AlCu, may be bonded to the first substrate, conductive stack to copper conductive pad. Further substrates may be stacked similarly.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
  a first substrate with a conductive pad; and
  a conductive stack disposed on the conductive pad, the conductive stack comprising:
    a CU layer;
    a TaN layer disposed on the Cu layer;
    an AlCu layer disposed on the TaN layer, wherein the AlCu layer is configured for bonding to a second substrate; and
  a second substrate with a conductive region directly bonded to and contacts the AlCu layer.

2. The structure of claim 1 wherein the conductive pad comprises Ti.

3. The structure of claim 1 further comprising:
  a polyimide disposed on said first substrate, the polyimide having an opening over said conductive pad.

4. The structure of claim 1 wherein said TaN layer has a thickness of from 100-1000 Å.

5. The structure of claim 1 wherein said AlCu layer has a thickness of from 10,000-15,000 Å.

6. The structure of claim 1 wherein the conductive stack has substantially vertical straight sidewalls.

7. The structure of claim 6 wherein a space between said first substrate and said second substrate is filled with polymer.

8. A structure comprising:
  a first substrate comprising:
    a patterned Cu layer;
    a patterned TaN layer, disposed on the patterned Cu layer;
    a patterned AlCu layer, disposed on the patterned TaN layer; and
  a second substrate with a Cu region, wherein the patterned AlCu layer is directly bonded to and in contact with the Cu region, thereby bonding the first substrate to the second substrate.

9. The structure of claim 8 wherein the patterned Cu layer, patterned TaN layer, and patterned AlCu layer have a combined thickness of less than three microns.

10. The structure of claim 8 wherein said Cu region comprises a through silicon via.

11. The structure of claim 8, wherein the second substrate comprises:
  a second patterned Cu layer;
  a second patterned TaN layer, disposed on the second patterned Cu layer;
  a second patterned AlCu layer, disposed on the second patterned TaN layer; and
  a third substrate with a second Cu region, wherein the second patterned AlCu layer is bonded to the second Cu region, thereby bonding the second substrate to the third substrate.

12. The structure of claim 11, wherein the Cu region and the second Cu region comprise through silicon via structures.

13. The structure of claim 8 wherein said patterned TaN layer has a thickness of from 100-1000 Å.

14. The structure of claim 8 wherein said patterned AlCu layer has a thickness of from 10,000-15,000 Å.

15. The structure of claim 8 further comprising a polymer filling a space between said first and second substrates.

16. A packaged integrated circuit comprising:
a first substrate including a plurality of conductive pads, at least one of the plurality of conductive pads having disposed thereon:
 a Cu layer;
 a TaN layer, disposed on the Cu layer; and
 an AlCu layer, disposed on the TaN layer; and
a second substrate including a plurality of conductive regions, wherein the at least one of the conductive pads is directly bonded to and in contact with one of the plurality of conductive regions.

17. The packaged integrated circuit of claim 16 further comprising a polymer filling a space between the first and second substrates.

18. The packaged integrated circuit of claim 16 wherein, each the TaN layer has a thickness of from 100-1000 Å and the AlCu layer has a thickness of from 10,000-15,000 Å.

19. The packaged integrated circuit of claim 16 wherein the Cu layer, TaN layer, and AlCu have a combined thickness of less than three microns.

20. The packaged integrated circuit of claim 16 wherein the one of the conductive regions comprises a through silicon via.

* * * * *